United States Patent
Kim et al.

(10) Patent No.: US 11,177,078 B2
(45) Date of Patent: Nov. 16, 2021

(54) LIGHT-ABSORBING LAYER PRECURSOR, ORGANIC-INORGANIC HYBRID SOLAR CELL MANUFACTURING METHOD USING SAME, AND ORGANIC-INORGANIC HYBRID SOLAR CELL

(71) Applicant: LG CHEM, LTD., Seoul (KR)

(72) Inventors: Yongnam Kim, Daejeon (KR); Yun Hye Hahm, Daejeon (KR); Jong Seok Kim, Daejeon (KR); Sang Jun Park, Daejeon (KR); Seiyong Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/958,109

(22) PCT Filed: Dec. 10, 2018

(86) PCT No.: PCT/KR2018/015607
§ 371 (c)(1),
(2) Date: Jun. 25, 2020

(87) PCT Pub. No.: WO2019/132318
PCT Pub. Date: Jul. 4, 2019

(65) Prior Publication Data
US 2020/0365334 A1   Nov. 19, 2020

(30) Foreign Application Priority Data

Dec. 26, 2017 (KR) .................. 10-2017-0179568
Dec. 7, 2018 (KR) .................. 10-2018-0156846

(51) Int. Cl.
| | | |
|---|---|---|
| H01G 9/20 | (2006.01) |
| H01L 51/42 | (2006.01) |
| H01G 9/00 | (2006.01) |

(52) U.S. Cl.
CPC ......... *H01G 9/2009* (2013.01); *H01G 9/0029* (2013.01); *H01L 51/4213* (2013.01)

(58) Field of Classification Search
None
See application file for complete search history.

(56) References Cited

U.S. PATENT DOCUMENTS

| 6,420,056 B1 | 7/2002 | Chondroudis et al. |
| 8,574,953 B2 | 11/2013 | DeHaven et al. |

(Continued)

FOREIGN PATENT DOCUMENTS

| JP | 2003-309308 | 10/2003 |
| JP | 2015-191916 | 11/2015 |

(Continued)

OTHER PUBLICATIONS

Lee et al., "High-Efficiency Perovskite Solar Cells Based on the Black Polymorph of HC(NH2)2PbI3," Advanced Materials, Published Jun. 13, 2014, pp. 4991-4998, vol. 26, Issue 29.

(Continued)

*Primary Examiner* — Eli S Mekhlin
(74) *Attorney, Agent, or Firm* — Dentons US LLP

(57) ABSTRACT

A precursor for a light absorbing layer, including a perovskite precursor, and a fluorine-based organic compound in an amount of 0.005 wt % to 0.5 wt % based on the mass of the perovskite precursor, and a method for manufacturing an organic-inorganic hybrid solar cell using the same.

7 Claims, 3 Drawing Sheets

(56) References Cited

U.S. PATENT DOCUMENTS

| | | | |
|---|---|---|---|
| 10,626,326 B2 | 4/2020 | Lee et al. | |
| 2016/0015652 A1* | 1/2016 | John | B01J 35/002 |
| | | | 424/490 |
| 2017/0005282 A1 | 1/2017 | Maehara | |
| 2017/0084399 A1 | 3/2017 | Vak | |
| 2017/0346024 A1 | 11/2017 | Lee et al. | |
| 2017/0372847 A1 | 12/2017 | Satou et al. | |
| 2019/0093010 A1* | 3/2019 | Rand | H01G 9/2009 |
| 2020/0028022 A1* | 1/2020 | Huang | H01L 31/032 |

FOREIGN PATENT DOCUMENTS

| | | |
|---|---|---|
| JP | 5943492 | 7/2016 |
| KR | 10-2001-0015084 | 2/2001 |
| KR | 10-2014-0007045 | 1/2014 |
| KR | 10-2015-0143010 | 12/2015 |
| KR | 10-1746296 | 6/2017 |
| KR | 10-1746297 | 6/2017 |
| KR | 10-1746335 | 6/2017 |
| KR | 10-2017-0121227 | 11/2017 |
| KR | 10-1810155 | 12/2017 |

OTHER PUBLICATIONS

International Search Report and the Written Opinion of PCT/KR2018/015607, dated Mar. 14, 2019.

\* cited by examiner

[Figure 1]
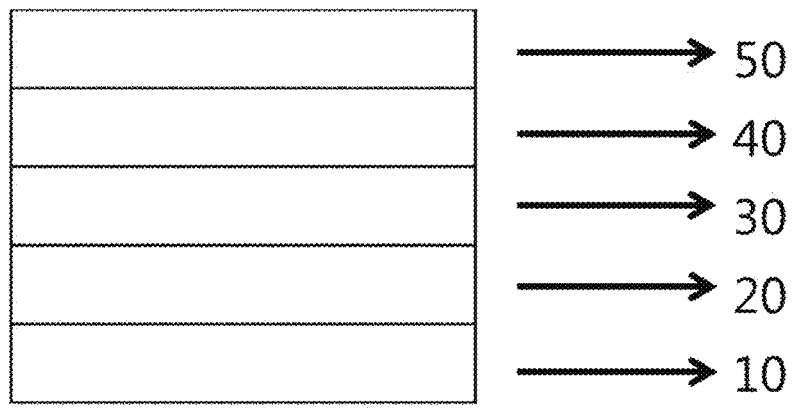
[Figure 2]
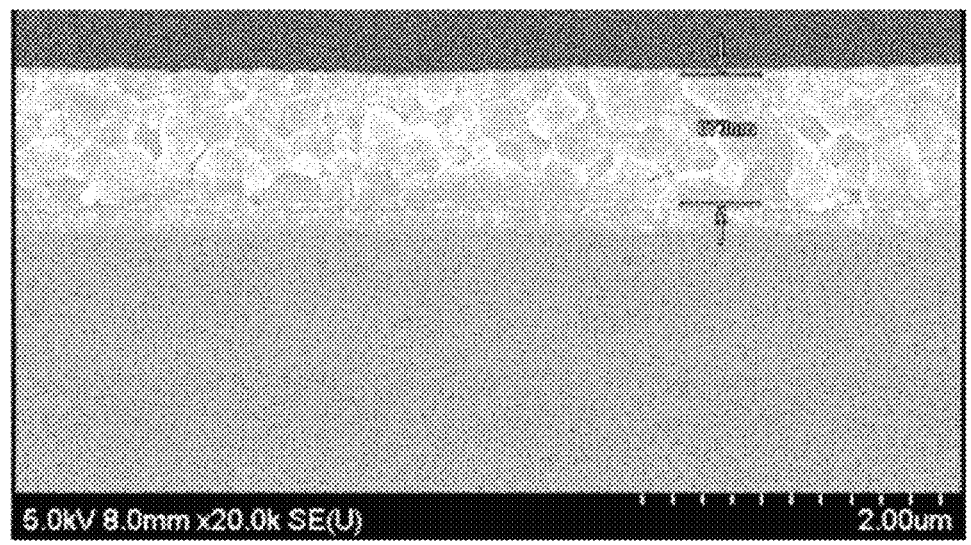

[Figure 3]
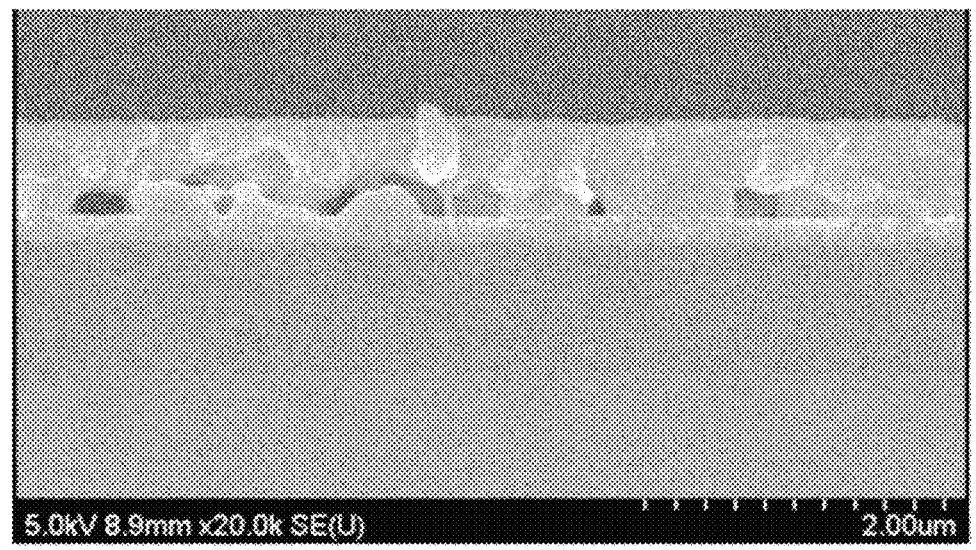
[Figure 4]
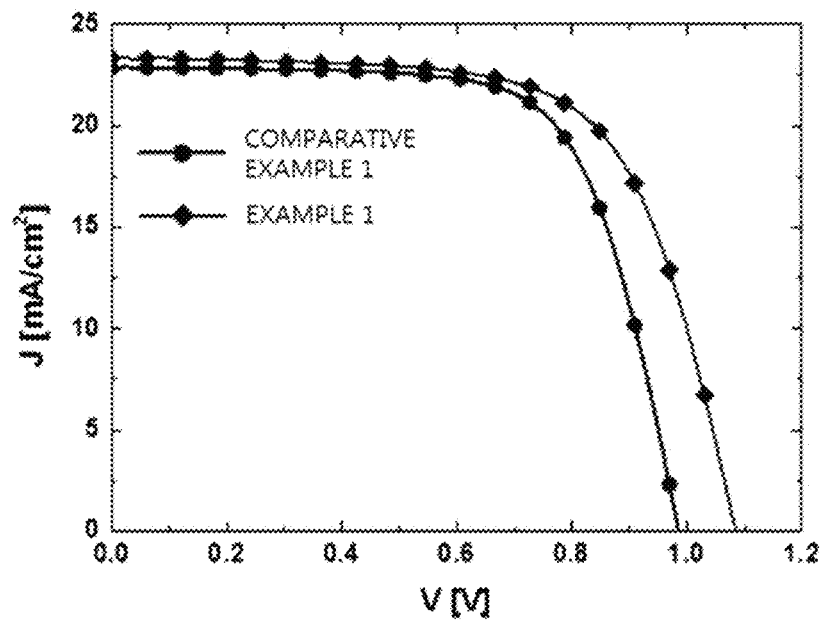

[Figure 5]
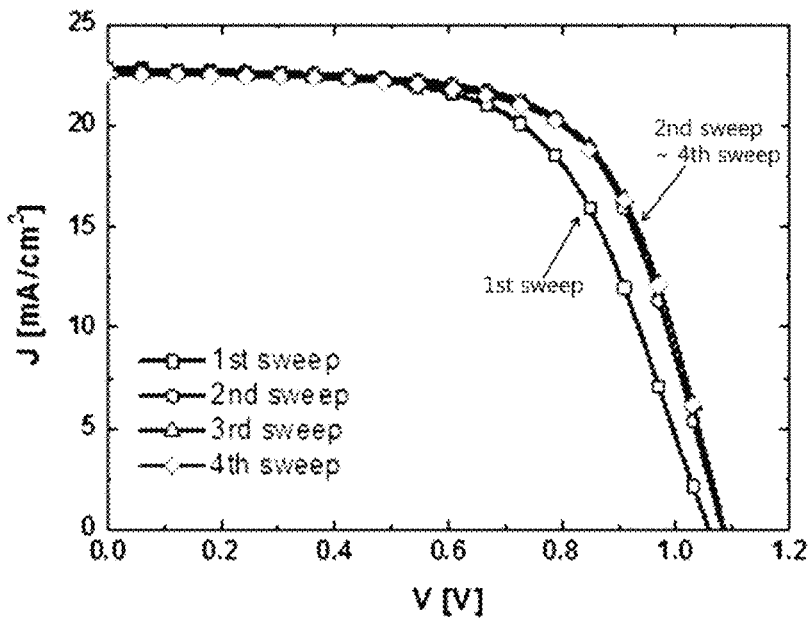
[Figure 6]
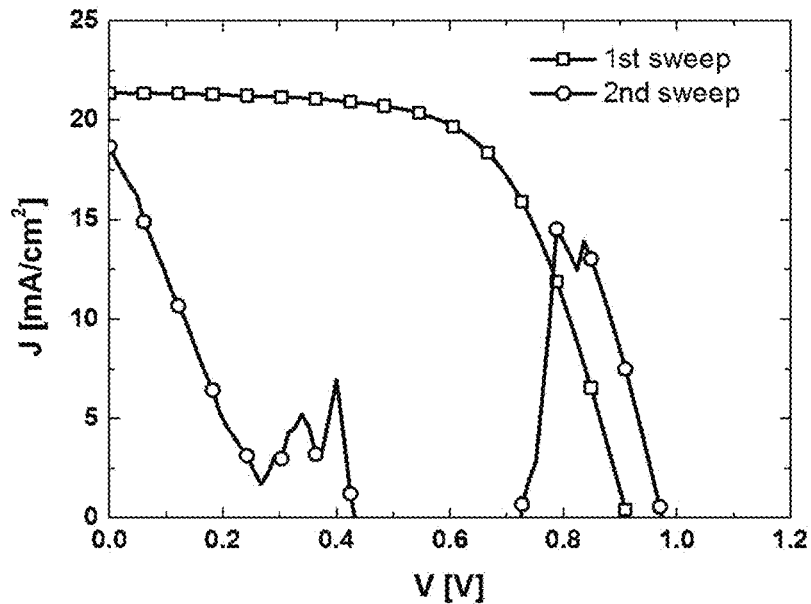

ated by the manufacturing method.
LIGHT-ABSORBING LAYER PRECURSOR, ORGANIC-INORGANIC HYBRID SOLAR CELL MANUFACTURING METHOD USING SAME, AND ORGANIC-INORGANIC HYBRID SOLAR CELL This application is a National Stage Application of International Application No. PCT/KR2018/015607 filed on Dec. 10, 2018, which claims priority to and the benefit of Korean Patent Application Nos. 10-2017-0179568 and 10-2018-0156846 filed in the Korean Intellectual Property Office on Dec. 26, 2017 and Dec. 7, 2018, respectively, the entire contents of which are incorporated herein by reference.

TECHNICAL FIELD

The present specification relates to a precursor for a light absorbing layer, a method for manufacturing an organic-inorganic hybrid solar cell, and an organic-inorganic hybrid solar cell, using the same.

BACKGROUND

In order to solve global environmental problems caused by the depletion of fossil fuels and the use thereof, studies have been actively conducted on alternative energy sources, which may be regenerated and are clean, such as solar energy, wind power, and water power. Among them, interests in solar cells which change electric energy directly from the sunlight have been greatly increased. Here, the solar cell means a cell which produces current-voltage by using a photovoltaic effect of absorbing photoenergy from the sunlight to generate electrons and holes.

Organic-inorganic hybrid perovskite materials have recently drawn attention as a light absorbing material for organic-inorganic hybrid solar cells due to the characteristics in which the absorption coefficient is high and the materials can be easily synthesized through a solution process.

However, although an organic-inorganic hybrid solar cell to which an existing perovskite material is applied has high efficiency, there is a problem in that during the manufacture of a device having a large area (5 cm$^2$ or more), the efficiency is decreased as compared to the size of the device due to an issue such as defects of a light absorbing layer, an increase in resistance, and the like. Further, since moisture resistance is weak, there is a problem in that a separate encapsulation technology needs to be performed in order to secure long-term stability.

Technical Problem

The present specification provides a precursor for a light absorbing layer, having a simple production process and capable of improving coating uniformity when applied to a light absorbing layer, and an organic-inorganic hybrid solar cell using the same.

Further, the present specification provides an organic-inorganic hybrid solar cell having excellent stability and energy conversion efficiency.

Technical Solution

An exemplary embodiment of the present specification provides a precursor for a light absorbing layer, including: a perovskite precursor; and 0.005 wt % to 0.5 wt % of a fluorine-based organic compound based on the perovskite precursor.

Another exemplary embodiment of the present specification provides a method for manufacturing an organic-inorganic hybrid solar cell, the method including:
preparing a first electrode;
forming a first common layer on the first electrode;
forming a light absorbing layer by coating the precursor for a light absorbing layer onto the first common layer;
forming a second common layer on the light absorbing layer; and
forming a second electrode on the second common layer.

Still another exemplary embodiment of the present specification provides an organic-inorganic hybrid solar cell manufactured by the manufacturing method.

Yet another exemplary embodiment of the present specification provides an organic-inorganic hybrid solar cell including:
a first electrode;
a first common layer provided on the first electrode;
a light absorbing layer provided on the first common layer;
a second common layer provided on the light absorbing layer; and
a second electrode provided on the second common layer,
in which the light absorbing layer includes: a compound having a perovskite structure; and a fluorine-based organic compound, and
the fluorine-based organic compound is included in an amount of 0.005 wt % to 5 wt % based on a mass of the light absorbing layer.

Advantageous Effects

A precursor for a light absorbing layer according to an exemplary embodiment of the present specification includes a fluorine-based organic compound, and thus has an effect of increasing the coating uniformity even though a light absorbing layer is formed to have a large area.

Further, the method for manufacturing an organic-inorganic hybrid solar cell according to an exemplary embodiment of the present specification has an advantage in that it is possible to manufacture an organic-inorganic hybrid solar cell in which the interfacial characteristics of a light absorption layer are improved, and as a result, the current density and the energy conversion efficiency are improved.

In addition, the method for manufacturing an organic-inorganic hybrid solar cell according to an exemplary embodiment of the present specification has an advantage in that it is possible to manufacture an organic-inorganic hybrid solar cell in which a broad light spectrum is absorbed, and as a result, the light energy loss is reduced, and the long-term stability and the energy conversion efficiency are improved.

BRIEF DESCRIPTION OF THE DRAWINGS

FIG. 1 is a view exemplifying a structure of each of organic-inorganic hybrid solar cells according to exemplary embodiments of the present specification.

FIG. 2 is a view illustrating a scanning electron microscope (SEM) image of a cross-section of an organic-inorganic hybrid solar cell manufactured in Example 1.

FIG. 3 is a view illustrating a scanning electron microscope (SEM) image of a cross-section of an organic-inorganic hybrid solar cell manufactured in Comparative Example 1.

FIG. 4 is a view illustrating a result of measuring current density according to a voltage in the organic-inorganic hybrid solar cell according to an exemplary embodiment of the present specification.

FIG. 5 is a view illustrating a result of repeatedly measuring a current density according to a voltage in the organic-inorganic hybrid solar cell manufactured in Example 1.

FIG. 6 is a view illustrating a result of repeatedly measuring a current density according to a voltage in the organic-inorganic hybrid solar cell manufactured in Comparative Example 1.

10: First electrode
20: First common layer
30: Light absorbing layer
40: Second common layer
50: Second electrode

DETAILED DESCRIPTION

Hereinafter, the present specification will be described in detail.

When one part "includes" one constituent element in the present specification, unless otherwise specifically described, this does not mean that another constituent element is excluded, but means that another constituent element may be further included.

When one member is disposed "on" another member in the present specification, this includes not only a case where the one member is brought into contact with another member, but also a case where still another member is present between the two members.

A precursor for a light absorbing layer according to an exemplary embodiment of the present specification includes: a perovskite precursor; and 0.005 wt % to 0.5 wt % of a fluorine-based organic compound based on the mass of the perovskite precursor.

An exemplary embodiment of the present specification includes the fluorine-based organic compound in an amount of 0.005 wt % to 0.5 wt %, and thus may exhibit an effect of improving device driving stability without any deterioration in electrical characteristics when a light absorbing layer is formed.

More specifically, the precursor for a light absorbing layer includes: a perovskite precursor; and 0.01 wt % to 0.2 wt % of a fluorine-based organic compound based on the mass of the perovskite precursor.

In the present specification, the "organic compound" is a compound including a hydrocarbon as a base skeleton, and means a compound having a skeleton structure composed of a covalent bond of carbon-carbon and carbon-hydrogen. In this case, the skeleton structure may be substituted with another element.

In the present specification, the "fluorine-based organic compound" means that fluorine is included in a main chain of an organic compound.

In an exemplary embodiment of the present specification, the fluorine-based organic compound can be used without limitation as long as the fluorine-based organic compound is a material used in the art, and specifically, the main chain thereof may include at least one of a fluoro group and a perfluoro alkyl group.

In an exemplary embodiment of the present specification, the fluorine-based organic compound includes a fluorine-based surfactant.

In the present specification, the "surfactant" means a material having both a hydrophilic portion and a hydrophobic portion in the molecule thereof.

In an exemplary embodiment of the present specification, the fluorine-based surfactant can be used without limitation as long as the fluorine-based surfactant is a material used in the art, and specifically, the main chain may be composed of a combination of a hydrophilic group, a lipophilic group, a fluoro group, and a perfluoro alkyl group, but is not limited thereto.

In an exemplary embodiment of the present specification, the fluorine-based surfactant may be of the following Formula A.

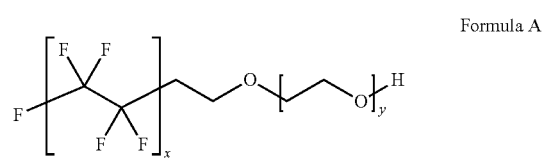

Formula A

In Formula A, x and y are each an integer from 1 to 10.

Specifically, FS-31 manufactured by Dupont Co., Ltd., FS-300 manufactured by Zonyl, RS-72-K manufactured by DIC Corporation, or FC-4430 manufactured by 3M Company may be used as the fluorine-based organic compound.

In an exemplary embodiment of the present specification, the perovskite precursor includes an organic halide and a metal halide.

In an exemplary embodiment of the present specification, the fluorine-based organic compound is a fluorine-based surfactant.

In the present specification, a "precursor" means a material in a step before the material becomes a specific material in any metabolism or reaction. For example, a perovskite precursor means a material in a step before the material becomes a perovskite material, and a precursor for a light absorbing layer means a precursor material for forming a light absorbing layer.

In an exemplary embodiment of the present specification, the organic halide is of any one of the following Formulae 1 to 3.

$$R1X1 \qquad \text{Formula 1}$$

$$R2_a R3_{(1-a)} X2_e X3_{(1-e)} \qquad \text{Formula 2}$$

$$R4_b R5_c R6_d X4_e X5_{(1-e')} \qquad \text{Formula 3}$$

In Formulae 1 to 3,

R2 and R3 are different from each other,

R4, R5, and R6 are different from each other,

R1 to R6 are each a monovalent cation selected from $C_nH_{2n+1}NH_3^+$, $NH_4^+$, $HC(NH_2)_2^+$, $Cs^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$, X1 to X5 are the same as or different from each other, and are each independently a halogen ion, n is an integer from 1 to 9, a is a real number of $0<a<1$, b is a real number of $0<b<1$, c is a real number of $0<c<1$, d is a real number of $0<d<1$, $b+c+d=1$, e is a real number of $0<e<1$, and e' is a real number of $0<e'<1$.

In an exemplary embodiment of the present specification, R1 to R6 are each a monovalent cation selected from $C_nH_{2N+1}NH_3^+$, $NH_4^+$, $HC(NH_2)_2^+$, $Cs^+$, $NF_4^+$, $NCl_4^+$, $PF_4^+$, $PCl_4^+$, $CH_3PH_3^+$, $CH_3AsH_3^+$, $PH_4^+$, and $AsH_4^+$. More specifically, R1 to R6 are each a monovalent cation selected from $C_nH_{2n+1}NH_3^+$, $HC(NH_2)_2^+$, and $Cs^+$.

In an exemplary embodiment of the present specification, the organic halide is $CH_3NH_3I$, $HC(NH_2)_2I$, $CH_3NH_3Br$, $HC(NH_2)_2Br$, $(CH_3NH_3)_a(HC(NH_2)_2)_{(1-a)}I_eBr_{(1-e)}$, or $(HC(NH_2)_2)_b(CH_3NH_3)_cCs_dI_eBr_{(1-e)}$, a is a real number of $0<a<1$, b is a real number of $0<b<1$, c is a real number of $0<c<1$, d is a real number of $0<d<1$, $b+c+d=1$, and e is a real number of $0<e<1$.

In an exemplary embodiment of the present specification, X2 and X3 are different from each other.

In an exemplary embodiment of the present specification, X4 and X5 are different from each other.

In an exemplary embodiment of the present specification, X1 to X5 are each independently I or Br.

In an exemplary embodiment of the present specification, the metal halide of the following Formula 4.

$$M1X6_2 \qquad \text{Formula 4}$$

In Formula 4,

M1 is a divalent metal ion selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, and X6 is a halogen ion.

In an exemplary embodiment of the present specification, M1 is $Pb^{2+}$.

In an exemplary embodiment of the present specification, X6 is I or Br.

In an exemplary embodiment of the present specification, the metal halide is $PbI_2$ or $PbBr_2$.

In an exemplary embodiment of the present specification, the precursor for a light absorbing layer may be in a solution state. For example, the precursor for a light absorbing layer may be in a state where the fluorine-based organic compound, the organic halide, and the metal halide are dissolved in a solvent.

In an exemplary embodiment of the present specification, the solvent may include at least one of dimethylformamide (DMF), isopropyl alcohol (IPA), dimethylsulfoxide (DMSO), Y-butyrolactone (GBL), n-methylpyrrolidone (NMP), propylene glycol methyl ether (PGME), propylene glycol monomethyl ether acetate (PGMEA), and dimethylacetamide (DMac).

An exemplary embodiment of the present specification provides a method for manufacturing an organic-inorganic hybrid solar cell, the method including:

preparing a first electrode;

forming a first common layer on the first electrode;

forming a light absorbing layer by coating the precursor for a light absorbing layer onto the first common layer;

forming a second common layer on the light absorbing layer; and forming a second electrode on the second common layer.

In an exemplary embodiment of the present specification, the coating of the precursor for a light absorbing layer includes: coating a precursor for a light absorbing layer onto the first common layer; and drying, baking, or annealing the coated precursor for a light absorbing layer.

In an exemplary embodiment of the present specification, the coating of the precursor for a light absorbing layer may use spin coating, slit coating, dip coating, inkjet printing, gravure printing, spray coating, doctor blade, bar coating, brush painting, or a thermal deposition method. Specifically, spin coating may be performed.

In an exemplary embodiment of the present specification, the drying, baking, or annealing of the precursor for a light absorbing layer may be performed at a temperature of 80° C. to 150° C. for 10 minutes to 60 minutes.

Specifically, the coating of the precursor for a light absorbing layer may be a process of spin-coating the precursor solution for a light absorbing layer onto the first common layer, and then annealing the spin-coated precursor at a temperature of 100° C. for 30 minutes.

An exemplary embodiment of the present specification provides an organic-inorganic hybrid solar cell manufactured by the method for manufacturing an organic-inorganic hybrid solar cell.

An exemplary embodiment of the present specification provides an organic-inorganic hybrid solar cell including:

a first electrode;

a first common layer provided on the first electrode;

a light absorbing layer provided on the first common layer;

a second common layer provided on the light absorbing layer; and a second electrode provided on the second common layer, in which the light absorbing layer includes: a compound having a perovskite structure; and a fluorine-based organic compounds, and the fluorine-based organic compound is included in an amount of 0.005 wt % to 5 wt % based on a mass of the light absorbing layer.

In the organic-inorganic hybrid solar cell, the fluorine-based organic compound is the same as those described above in the manufacturing method.

FIG. 1 illustrates a structure of an organic-inorganic hybrid solar cell according to an exemplary embodiment of the present specification. Specifically, FIG. 1 illustrates an organic-inorganic hybrid solar cell in which a first electrode 10, a first common layer 20, a light absorbing layer 30, a second common layer 40, and a second electrode 50 are sequentially stacked.

The organic-inorganic hybrid solar cell according to the present specification is not limited to the stacking structure in FIG. 1, and may further include an additional member.

In an exemplary embodiment of the present specification, the compound having a perovskite structure is of any one of the following Formulae 5 to 7.

$$R1M1X1_3 \qquad \text{Formula 5}$$

$$R2_aR3_{(1-a)}M2X2_zX3_{(3-z)} \qquad \text{Formula 6}$$

$$R4_bR5_cR6_dM3X4_zX5_{(3-z')} \qquad \text{Formula 7}$$

in Formulae 5 to 7,

R2 and R3 are different from each other,

R4, R5, and R6 are different from each other,

R1 to R6 are each a monovalent cation selected from $C_nH_{2n+1}NH_3^+$, $NH_4^+$, $HC(NH_2)_2^+$, $Cs^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$, M1 to M3 are the same as or different from each other, and are each independently a divalent metal ion selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Bi^{2+}$, $Pb^{2+}$, and $Yb^{2+}$, X1 to X5 are the same as or different from each other, and are each independently a halogen ion, n is an integer from 1 to 9, a is a real number of $0<a<1$, b is a real number of 0<b<1,
c is a real number of 0<c<1,
d is a real number of 0<d<1,
b+c+d=1,
z is a real number of 0<z<3, and
z' is a real number of 0<z'<3.

In an exemplary embodiment of the present specification, the compound having the perovskite structure in the light absorbing layer may include a single cation. In the present specification, the single cation means that one kind of monovalent cation is used. That is, R1 in Formula 5 means that only one kind of monovalent cation is selected. For example, R1 in Formula 5 is $C_nH_{2n+1}NH_3^+$, and n may be an integer from 1 to 9.

In an exemplary embodiment of the present specification, the compound having the perovskite structure in the light absorption layer may include a complex cation. In the present specification, the complex cation means that two or more kinds of monovalent cations are used. That is, the complex cation means that different monovalent cations are selected as R2 and R3 in Formula 6, and different monovalent cations are selected as R4 to R6 in Formula 7. For example, R2 and R3 in Formula 6 may be $C_nH_{2n+1}NH_3^+$ and $HC(NH_2)_2^+$, respectively. In addition, R4, R5, and R6 in Formula 7 may be $C_nH_{2n+1}NH_3^+$, $HC(NH_2)_2^+$, and $Cs^+$, respectively.

In an exemplary embodiment of the present specification, the compound having the perovskite structure is represented by Formula 5.

In an exemplary embodiment of the present specification, the compound having the perovskite structure is represented by Formula 6.

In an exemplary embodiment of the present specification, the compound having the perovskite structure is represented by Formula 7.

In an exemplary embodiment of the present specification, R1 to R6 are each $C_nH_{2n+1}NH_3^+$, $HC(NH_2)_2^+$, or $Cs^+$. In this case, R2 and R3 are different from each other, and R4 to R6 are different from each other.

In an exemplary embodiment of the present specification, R1 is $CH_3NH_3^+$, $HC(NH_2)_2^+$, or $Cs^+$.

In an exemplary embodiment of the present specification, R2 and R4 are each $CH_3NH_3^+$.

In an exemplary embodiment of the present specification, R3 and R5 are each $HC(NH_2)_2^+$.

In an exemplary embodiment of the present specification, R6 is $Cs^+$.

In an exemplary embodiment of the present specification, M1 to M3 are each $Pb^{2+}$.

In an exemplary embodiment of the present specification, X2 and X3 are different from each other.

In an exemplary embodiment of the present specification, X4 and X5 are different from each other.

In an exemplary embodiment of the present specification, X1 to X5 are each F or Br.

In an exemplary embodiment of the present specification, a is a real number of 0<a<1, such that the sum of R2 and R3 becomes 1. Furthermore, z is a real number of 0<z<3, such that the sum of X2 and X3 becomes 3.

In an exemplary embodiment of the present specification, b is a real number of 0<b<1, c is a real number of 0<c<1, d is a real number of 0<d<1, and b+c+d=1, such that the sum of R4, R5, and R6 becomes 1. Furthermore, z' is a real number of 0<z'<3, such that the sum of X4 and X5 becomes 3.

In an exemplary embodiment of the present specification, the compound having the perovskite structure is $CH_3NH_3PbI_3$, $HC(NH_2)_2PbI_3$, $CH_3NH_3PbBr_3$, $HC(NH_2)_2PbBr_3$, $(CH_3NH_3)_a(HC(NH_2)_2)_{(1-a)}PbI_zBr_{(3-z)}$, or $(HC(NH_2)_2)_b(CH_3NH_3)_cCs_dPbI_zBr_{(3-z')}$, a is a real number of 0<a<1, b is a real number of 0<b<1, c is a real number of 0<c<1, d is a real number of 0<d<1, b+c+d=1, z is a real number of 0<z<3, and z' is a real number of 0<z'<3.

In an exemplary embodiment of the present specification, the light absorbing layer includes a fluorine-based organic compound in an amount of 0.005 wt % to 5 wt % based on a mass of the light absorbing layer. Specifically, the light absorbing layer includes a fluorine-based organic compound in an amount of 0.005 wt % to 3 wt % based on a mass of the light absorbing layer. More specifically, the light absorbing layer includes a fluorine-based organic compound in an amount of 0.005 wt % to 1 wt % based on a mass of the light absorbing layer. More specifically, the light absorbing layer includes a fluorine-based organic compound in an amount of 0.005 wt % to 0.5 wt % based on a mass of the light absorbing layer.

A content range of the fluorine-based organic compound based on the mass of the light absorbing layer is a content range produced by using an organic compound within the above-described range in the precursor for a light absorbing layer. That is, when a fluorine-based organic compound is included in an amount of 0.005 wt % to 0.5 wt % based on a perovskite precursor in the precursor for a light absorbing layer, the organic compound in a light absorbing layer formed by using the precursor for a light absorbing layer is included in an amount of 0.005 wt % to 5 wt % based on a mass of the light absorbing layer.

In an exemplary embodiment of the present specification, a content of the organic compound included in the light absorbing layer can be measured by a method used in the art. For example, the content can be measured by using a mass analysis method such as liquid chromatography coupled to mass spectrometry (LCMS) or gas chromatography coupled to mass spectrometry (GCMS); high-performance liquid chromatography (HPLC); and nuclear magnetic resonance (NMR), and the like.

In the present specification, a first common layer and a second common layer each mean an electron transport layer or a hole transport layer. In this case, the first common layer and the second common layer are not the same layer, and for example, when the first common layer is an electron transport layer, the second common layer is a hole transport layer, and when the first common layer is a hole transport layer, the second common layer is an electron transport layer.

In an exemplary embodiment of the present specification, the organic-inorganic hybrid solar cell may further include a substrate on the lower portion of the first electrode.

In an exemplary embodiment of the present specification, as the substrate, it is possible to use a substrate having excellent transparency, surface smoothness, handling easiness, and waterproofing property. Specifically, a glass substrate, a thin film glass substrate, or a plastic substrate may be used. The plastic substrate may include a flexible film such as polyethylene terephthalate (PET), polyethylene naphthalate (PEN), polyether ether ketone, and polyimide in the form of a single layer or a multi-layer. However, the substrate is not limited thereto, and a substrate typically used for an organic-inorganic hybrid solar cell may be used.

In the present specification, the first electrode may be an anode, and the second electrode may be a cathode. Further, the first electrode may be a cathode, and the second electrode may be an anode.

In an exemplary embodiment of the present specification, the first electrode may be a transparent electrode, and the organic-inorganic hybrid solar cell may absorb light by way of the first electrode.

In an exemplary embodiment of the present specification, when the first electrode is a transparent electrode, as the first electrode, it is possible to use an electrode in which a material having conductivity is doped on a flexible and transparent material such as plastic including polyethylene terephthalate (PET), polyethylene naphthalate (PEN), polypropylene (PP), polyimide (PI), polycarbonate (PC), polystyrene (PS), polyoxyethylene (POM), an AS resin (acrylonitrile styrene copolymer), an ABS resin (acrylonitrile butadiene styrene copolymer), triacetyl cellulose (TAC), polyarylate (PAR), and the like, in addition to glass and a quartz plate. Specifically, the first electrode may be indium tin oxide (ITO), fluorine doped tin oxide (FTO), aluminum doped zinc oxide (AZO), indium zinc oxide (IZO), ZnO—$Ga_2O_3$, ZnO—$Al_2O_3$, antimony tin oxide (ATO), and the like, and more specifically, the first electrode may be ITO.

In an exemplary embodiment of the present specification, the first electrode may also be a semi-transparent electrode. When the first electrode is a semi-transparent electrode, the first electrode may be manufactured of a metal such as silver (Ag), gold (Au), magnesium (Mg), or an alloy thereof.

In an exemplary embodiment of the present specification, the second electrode may be a metal electrode. Specifically, the metal electrode may include one or two or more selected from the group consisting of silver (Ag), aluminum (Al), platinum (Pt), tungsten (W), copper (Cu), molybdenum (Mo), gold (Au), nickel (Ni), palladium (Pd), magnesium (Mg), chromium (Cr), calcium (Ca), and samarium (Sm).

In an exemplary embodiment of the present specification, the organic-inorganic hybrid solar cell may have an n-i-p structure. When the organic-inorganic hybrid solar cell according to the present specification has an n-i-p structure, the second electrode may be a metal electrode, an oxide/metal composite electrode, or a carbon electrode. Specifically, the second metal may include gold (Au), silver (Ag), aluminum (Al), $MoO_3$/Au, $MoO_3$/Ag, $MoO_3$/Al, $V_2O_5$/Au, $V_2O_5$/Ag, $V_2O_5$/Al, $WO_3$/Au, $WO_3$/Ag, or $WO_3$/Al.

In the present specification, the n-i-p structure means a structure in which a first electrode, an electron transport layer, a light absorbing layer, a hole transport layer, and a second electrode are sequentially stacked.

In an exemplary embodiment of the present specification, the organic-inorganic hybrid solar cell may have a p-i-n structure. When the organic-inorganic complex solar cell according to the present specification has a p-i-n structure, the second electrode may be a metal electrode.

In the present specification, the p-i-n structure means a structure in which a first electrode, a hole transport layer, a light absorbing layer, an electron transport layer, and a second electrode are sequentially stacked.

In the present specification, a material for the hole transport layer and/or the electron transport layer may be a material which increases the probability that charges produced move to an electrode by efficiently transferring electrons and holes to a light absorbing layer, but is not particularly limited.

In an exemplary embodiment of the present specification, the electron transport layer may include a metal oxide. As the metal oxide, it is possible to specifically use one, or two or more selected from Ti oxide, Zn oxide, In oxide, Sn oxide, W oxide, Nb oxide, Mo oxide, Mg oxide, Zr oxide, Sr oxide, Yr oxide, La oxide, V oxide, Al oxide, Y oxide, Sc oxide, Sm oxide, Ga oxide, Ta oxide, SrTi oxide, and a composite thereof. Specifically, the metal oxide may be $TiO_2$, but is not limited thereto.

In an exemplary embodiment of the present specification, the electron transport layer may improve characteristics of charges using doping, and may modify the surface using a fluorene derivative, and the like.

In an exemplary embodiment of the present specification, the electron transport layer may be formed by being applied onto one surface of a first electrode or coated in the form of a film by using a method such as sputtering, E-Beam, thermal deposition, spin coating, screen printing, inkjet printing, doctor blade, or gravure printing.

In an exemplary embodiment of the present specification, the hole transport layer may be an anode buffer layer.

In an exemplary embodiment of the present specification, the hole transport layer may be introduced by a method such as spin coating, dip coating, inkjet printing, gravure printing, spray coating, doctor blade, bar coating, gravure coating, brush painting, and thermal deposition.

In an exemplary embodiment of the present specification, tertiary butyl pyridine (tBP), lithium bis(trifluoro methanesulfonyl)imide (LiTFSI), poly(3,4-ethylenedioxythiophene):poly(4-styrenesulfonate)(PEDOT:PSS), 2,2',7,7'-tetrakis(N,N-di-p-methoxyphenylamine)-9,9"-spirobifluorene (Spiro-OMeTAD) may be used in the hole transport layer, but the material is not limited thereto.

MODE FOR INVENTION

Hereinafter, the present specification will be described in detail with reference to Examples for specifically describing the present specification. However, the Examples according to the present specification may be modified in various forms, and it is not interpreted that the scope of the present specification is limited to the Examples described below in detail. The Examples of the present specification are provided to more completely explain the present specification to a person with ordinary skill in the art.

Example 1

A solution in which 2 wt % of titanium dioxide ($TiO_2$) was included in isopropyl alcohol was spin-coated at 2,000 rpm onto an alkali-free glass substrate sputtered with indium tin oxide (ITO), and then heated at 150° C. for 30 minutes. Thereafter, a solution in which a perovskite (($HC(NH_2)_2)_x$ $(CH_3NH_3)_yCs_{1-x-y}PbI_zBr_{3-z}$ (0<x<1, 0<y<1, 0.8<x+y<1, 0<z<3)) precursor and 0.05 wt % of a fluorine-based organic compound (manufactured by 3M Company, FC-4430) based on the perovskite precursor were dissolved in dimethylformamide was spin-coated at 5,000 rpm, and then dried at 100° C. for 30 minutes, thereby forming a light absorbing layer. Thereafter, after Spiro-OMeTAD was dissolved in chlorobenzene, a solution to which tertiary butyl pyridine (tBP) and lithium bis(trifluoro methanesulfonyl)imide (LiTFSI) were added was spin-coated, and then Ag was vacuum deposited.

FIG. 2 illustrates a scanning electron microscope (SEM) image of a cross-section of an organic-inorganic hybrid solar cell manufactured in Example 1. From FIG. 2, it can be confirmed that the organic-inorganic hybrid solar cells produced according to exemplary embodiments of the present specification have no pores in the light absorbing layer, the surface of the light absorbing layer is uniform, and the crystal size is increased.

Comparative Example 1

A solution in which 2 wt % of $TiO_2$ was included in isopropyl alcohol was spin-coated at 2,000 rpm onto an alkali-free glass substrate sputtered with indium tin oxide (ITO), and then heated at 150° C. for 30 minutes. Thereafter, a solution in which a perovskite $((HC(NH_2)_2)_x(CH_3NH_3)_y Cs_{1-x-y}PbI_zBr_{3-z}$ (0<x<1, 0<y<1, 0.8<x+y<1, 0<z<3)) precursor was dissolved in dimethylformamide was spin-coated at 5,000 rpm, and then dried at 100° C. for 30 minutes, thereby forming a light absorbing layer. Thereafter, after Spiro-OMeTAD was dissolved in chlorobenzene, a solution to which tBP and LiTFSI were added was spin-coated, and then Ag was vacuum deposited.

FIG. 3 illustrates a scanning electron microscope (SEM) image of a cross-section of an organic-inorganic hybrid solar cell manufactured in Comparative Example 1. From FIG. 3, it can be confirmed that in the case of the organic-inorganic hybrid solar cell manufactured in Comparative Example 1, there are a large amount of pores on the cross-section of the light absorbing layer, the surface of the light absorbing layer is rough, and the crystal size is small as compared to Example 1.

Comparative Example 2

A solution in which 2 wt % of $TiO_2$ was included in isopropyl alcohol was spin-coated at 2,000 rpm onto an alkali-free glass substrate sputtered with indium tin oxide (ITO), and then heated at 150° C. for 30 minutes. Thereafter, a solution in which a perovskite $((HC(NH_2)_2)_x(CH_3NH_3)_y Cs_{1-x-y}PbI_zBr_{3-z}$ (0<x<1, 0<y<1, 0.8<x+y<1, 0<z<3)) precursor and 0.55 wt % of a fluorine-based organic compound (manufactured by 3M Company, FC-4430) based on the mass of the perovskite precursor were dissolved in dimethylformamide was spin-coated at 5,000 rpm, and then dried at 100° C. for 30 minutes, thereby forming a light absorbing layer. Thereafter, after Spiro-OMeTAD was dissolved in chlorobenzene, a solution to which tBP and LiTFSI were added was spin-coated, and then Ag was vacuum deposited.

Comparative Example 3

A solution in which 2 wt % of $TiO_2$ was included in isopropyl alcohol was spin-coated at 2,000 rpm onto an alkali-free glass substrate sputtered with indium tin oxide (ITO), and then heated at 150° C. for 30 minutes. Thereafter, a solution in which a perovskite $((HC(NH_2)_2)_x(CH_3NH_3)_y Cs_{1-x-y}PbI_zBr_{3-z}$ (0<x<1, 0<y<1, 0.8<x+y<1, 0<z<3)) precursor and 0.05 wt % of sodium lauryl sulfate based on the mass of the perovskite precursor were dissolved in dimethylformamide was spin-coated at 5,000 rpm, and then dried at 100° C. for 30 minutes, thereby forming a light absorbing layer. Thereafter, after Spiro-OMeTAD was dissolved in chlorobenzene, a solution to which tBP and LiTFSI were added was spin-coated, and then Ag was vacuum deposited.

Table 1 shows performances of organic-inorganic hybrid solar cells according to exemplary embodiments of the present specification.

TABLE 1

| | Fluorine-based organic compound (wt %) | PCE (%) | $J_{sc}$ (mA/cm$^2$) | $V_{oc}$ (V) | FF (%) |
|---|---|---|---|---|---|
| Example 1 | 0.05 | 16.8 | 23.4 | 1.09 | 66.4 |
| Comparative Example 1 | 0 | 15.5 | 22.8 | 0.986 | 68.8 |
| Comparative Example 2 | 0.55 | 6.2 | 22.5 | 0.964 | 28.8 |
| Comparative Example 3 | 0 | 0.6 | 17.3 | 0.127 | 27.7 |

In Table 1, $V_{oc}$, $J_{sc}$, FF, and PCE mean an open-circuit voltage, a short-circuit current, a fill factor, and energy conversion efficiency, respectively. The open-circuit voltage and the short-circuit current are an X axis intercept and a Y axis intercept, respectively, in the fourth quadrant of the voltage-current density curve, and as the two values are increased, the efficiency of the solar cell is preferably increased. In addition, the fill factor is a value obtained by dividing the maximum area of a rectangle, which may be drawn within the curve, by the product of the short-circuit current and the open-circuit voltage. The energy conversion efficiency may be obtained when these three values are divided by the intensity of the irradiated light, and the higher value is preferred.

From Table 1, it can be confirmed that when a fluorine-based organic compound is not included (Comparative Example 1) or when a fluorine-based organic compound is included in an amount of more than 0.5 wt % (Comparative Example 2), performances of the devices deteriorate. Further, it was confirmed that when another surfactant was used rather than a fluorine-based organic compound (Comparative Example 3), a normal device could not be manufactured.

FIG. 4 illustrates a result of measuring current density according to a voltage in the organic-inorganic hybrid solar cell according to an exemplary embodiment of the present specification.

For the organic-inorganic hybrid solar cells manufactured in Example 1 and Comparative Example 1, device stability was measured by using ABET Sun 3000 solar simulator as a light source and Keithley 2420 source meter. When the device stability was measured once, current was measured after voltage was applied by lowering the voltage by 12 mV per 0.1 second from 1.2 V to 0 V, and when the device stability was measured consecutively ten times, the standby time between measurements was 1 minute in the dark room state.

FIG. 5 illustrates a result of repeatedly measuring a current density according to a voltage in the organic-inorganic hybrid solar cell manufactured in Example 1. In FIG. 5, the 1st sweep exhibits the first measurement result, and 2nd to 4th sweeps are results sequentially measured from the 2nd measurement result to the 4th measurement result. From FIG. 5, it can be confirmed that even though the organic-inorganic hybrid solar cells manufactured according to exemplary embodiments of the present specification were measured repeatedly four times, the performance of the device is maintained. That is, it can be confirmed that when a fluorine-based organic compound is included in forming a light absorbing layer, stability of the manufactured organic-inorganic hybrid solar cell is excellent.

FIG. 6 illustrates a result of repeatedly measuring a current density according to a voltage in the organic-inorganic hybrid solar cell manufactured in Comparative Example 1. From FIG. 6, it can be confirmed that even though the organic-inorganic hybrid solar cell manufactured in the Comparative Example is measured only twice (2nd sweep in FIG. 6), the performance of the device deteriorates. That is, it can be confirmed that when a fluorine-based organic compound is not included in forming a light absorbing layer, stability of the manufactured organic-inorganic hybrid solar cell deteriorates.

The invention claimed is:

1. A precursor for a light absorbing layer, comprising:
a perovskite precursor comprising an organic halide and a metal halide for forming a compound having a perovskite structure of any one of the following Formulae 5 to 7:

$$R1M1X1_3 \qquad \text{Formula 5}$$

$$R2_aR3_{(1-a)}M2X2_zX3_{(3-z)} \qquad \text{Formula 6}$$

$$R4_bR5_cR6_dM3X4_{z'}X5_{(3-z')} \qquad \text{Formula 7}$$

wherein in Formulae 5 to 7:
R2 and R3 are different from each other, and R4, R5, and R6 are different from each other,
R1 to R6 are each a monovalent cation selected from $C_nH_{2n+1}NH_3^+$, $NH_4^+$, $HC(NH_2)_2^+$, $Cs^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$,
M1 to M3 are the same as or different from each other, and are each independently a divalent metal ion selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Bi^{2+}$, $Pb^{2+}$, and $Yb^{2+}$,
X1 to X5 are the same as or different from each other, and are each independently a halogen ion;
n is an integer from 1 to 9;
a is a real number of $0<a<1$;
b is a real number of $0<b<1$;
c is a real number of $0<c<1$;
d is a real number of $0<d<1$;
b+c+d=1;
z is a real number of $0<z<3$; and
z' is a real number of $0<z'<3$; and
0.005 wt % to 0.5 wt % of a fluorine-based surfactant comprising a perfluoro alkyl group based on a combined mass of the organic halide and the metal halide of the perovskite precursor.

2. The precursor of claim 1, wherein the organic halide is of any one of the following Formulae 1 to 3:

$$R1X1 \qquad \text{Formula 1}$$

$$R2_aR3_{(1-a)}X2_eX3_{(1-e)} \qquad \text{Formula 2}$$

$$R4_bR5_cR6_dX4_{e'}X5_{(1-e')} \qquad \text{Formula 3}$$

wherein Formulae 1 to 3;
R2 and R3 are different from each other;
R4, R5, and R6 are different from each other;
R1 to R6 are each a monovalent cation selected from $C_nH_{2n+1}NH_3^+$, $NH_4^+$, $HC(NH_2)_2^+$, $Cs^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$,
X1 to X5 are the same as or different from each other, and are each independently a halogen ion;
n is an integer from 1 to 9;
a is a real number of $0<a<1$;
b is a real number of $0<b<1$;
c is a real number of $0<c<1$;
d is a real number of $0<d<1$;
b+c+d=1;
e is a real number of $0<e<1$; and
e' is a real number of $0<e'<1$.

3. The precursor of claim 1, wherein the metal halide is of following Formula 4:

$$M1X6_2 \qquad \text{Formula 4}$$

wherein in Formula 4;
M1 is a divalent metal ion selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$; and
X6 is a halogen ion.

4. A method for manufacturing an organic-inorganic hybrid solar cell, the method comprising:
preparing a first electrode;
forming a first common layer on the first electrode;
forming a light absorbing layer by coating the precursor for a light absorbing layer according to claim 1 onto the first common layer;
forming a second common layer on the light absorbing layer; and
forming a second electrode on the second common layer.

5. An organic-inorganic hybrid solar cell manufactured according to claim 4.

6. An organic-inorganic hybrid solar cell comprising:
a first electrode;
a first common layer provided on the first electrode;
a light absorbing layer provided on the first common layer;
a second common layer provided on the light absorbing layer; and
a second electrode provided on the second common layer,
wherein the light absorbing layer comprises:
a compound having a perovskite structure; and
a fluorine-based surfactant included in an amount of 0.005 wt % to 5 wt % based on a mass of the light absorbing layer,
wherein the fluorine-based surfactant comprises a perfluoro alkyl group.

7. The organic-inorganic hybrid solar cell of claim 6, wherein the compound having the perovskite structure is any one of the following Formulae 5 to 7:

$$R1M1X1_3 \qquad \text{Formula 5}$$

$$R2_aR3_{(1-a)}M2X2_zX3_{(3-z)} \qquad \text{Formula 6}$$

$$R4_bR5_cR6_dM3X4_{z'}X5_{(3-z')} \qquad \text{Formula 7}$$

wherein in Formulae 5 to 7:
R2 and R3 are different from each other;
R4, R5, and R6 are different from each other,
R1 to R6 are each a monovalent cation selected from $C_nH_{2n+1}NH_3^+$, $NH_4^+$, $HC(NH_2)_2^+$, $Cs^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$,
M1 to M3 are the same as or different from each other, and are each independently a divalent metal ion selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Bi^{2+}$, $Pb^{2+}$, and $Yb^{2+}$,
X1 to X5 are the same as or different from each other, and are each independently a halogen ion;
n is an integer from 1 to 9;
a is a real number of $0<a<1$;
b is a real number of $0<b<1$;
c is a real number of $0<c<1$;
d is a real number of $0<d<1$;

b+c+d=1;
z is a real number of $0<z<3$; and
z' is a real number of $0<z'<3$.

\* \* \* \* \*

UNITED STATES PATENT AND TRADEMARK OFFICE
CERTIFICATE OF CORRECTION

PATENT NO. : 11,177,078 B2
APPLICATION NO. : 16/958109
DATED : November 16, 2021
INVENTOR(S) : Yongnam Kim et al.

It is certified that error appears in the above-identified patent and that said Letters Patent is hereby corrected as shown below:

In the Claims

At Column 13, Lines 11-46, please replace Claim 1 with the following:
1. A precursor for a light absorbing layer, comprising:
 a perovskite precursor comprising an organic halide and a metal halide for forming a compound having a perovskite structure of any one of the following Formulae 5 to 7:
 Formula 5
 $R1M1X1_3$
 Formula 6
 $R2_a R3_{(1-a)} M2X2_z X3_{(3-z)}$
 Formula 7
 $R4_b R5_c R6_d M3X4_{z'} X5_{(3-z')}$
 wherein in Formulae 5 to 7:
 R2 and R3 are different from each other, and R4, R5, and R6 are different from each other;
 R1 to R6 are each a monovalent cation selected from among $C_nH_{2n+1}NH_3^+$, $NH_4^+$, $HC(NH_2)_2^+$, $Cs^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$;
 M1 to M3 are the same as or different from each other, and are each independently a divalent metal ion selected from among $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Bi^{2+}$, $Pb^{2+}$, and $Yb^{2+}$;
 X1 to X5 are the same as or different from each other, and are each independently a halogen ion;
 n is an integer from 1 to 9;
 a is a real number of $0<a<1$;
 b is a real number of $0<b<1$;
 c is a real number of $0<c<1$;
 d is a real number of $0<d<1$;
 b+c+d=1;
 z is a real number of $0<z<3$; and Signed and Sealed this
First Day of February, 2022

Drew Hirshfeld
*Performing the Functions and Duties of the
Under Secretary of Commerce for Intellectual Property and
Director of the United States Patent and Trademark Office*

CERTIFICATE OF CORRECTION (continued)
U.S. Pat. No. 11,177,078 B2

$z'$ is a real number of $0<z'<3$; and 0.005 wt% to 0.5 wt% of a fluorine-based surfactant comprising a perfluoro alkyl group based on a combined mass of the organic halide and the metal halide of the perovskite precursor.

At Column 13, Lines 47-67, and at Column 14, Lines 1-3, please replace Claim 2 with the following:

2. The precursor of claim 1, wherein the organic halide is of any one of the following Formulae 1 to 3:

Formula 1
$R1X1$
Formula 2
$R2_a R3_{(1-a)} X2_e X3_{(1-e)}$
Formula 3
$R4_b R5_c R6_d X4_{e'} X5_{(1-e')}$ wherein in Formulae 1 to 3:

R2 and R3 are different from each other;

R4, R5, and R6 are different from each other;

R1 to R6 are each a monovalent cation selected from among $C_nH_{2n+1}NH_3^+$, $NH_4^+$, $HC(NH_2)_2^+$, $Cs^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$;

X1 to X5 are the same as or different from each other, and are each independently a halogen ion;

n is an integer from 1 to 9;

a is a real number such that $0 < a < 1$;

b is a real number such that $0 < b < 1$;

c is a real number such that $0 < c < 1$;

d is a real number such that $0 < d < 1$;

$b + c + d = 1$;

e is a real number such that $0 < e < 1$; and e' is a real number such that $0 < e' < 1$.

At Column 14, Lines 4-13, please replace Claim 3 with the following:

3. The precursor of claim 1, wherein the metal halide is of following Formula 4:

Formula 4
$M1X6_2$ wherein in Formula 4:

M1 is a divalent metal ion selected from among $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$; and X6 is a halogen ion.

UNITED STATES PATENT AND TRADEMARK OFFICE
CERTIFICATE OF CORRECTION

PATENT NO. : 11,177,078 B2
APPLICATION NO. : 16/958109
DATED : November 16, 2021
INVENTOR(S) : Yongnam Kim et al.

It is certified that error appears in the above-identified patent and that said Letters Patent is hereby corrected as shown below:

In the Claims

At Column 14, Lines 41-67, and at Column 15, Lines 1-3, please replace Claim 7 with the following:
7. The organic-inorganic hybrid solar cell of claim 6, wherein the compound having the perovskite structure is any one of the following Formulae 5 to 7:

Formula 5
$R1M1X1_3$
Formula 6
$R2_aR3_{(1-a)}M2X2_zX3_{(3-z)}$
Formula 7
$R4_bR5_cR6_dM3X4_{z'}X5_{(3-z')}$ wherein in Formulae 5 to 7:
R2 and R3 are different from each other;
R4, R5, and R6 are different from each other;
R1 to R6 are each a monovalent cation selected from among $C_nH_{2n+1}NH_3^+$, $NH_4^+$, $HC(NH_2)_2^+$, $Cs^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$;
M1 to M3 are the same as or different from each other, and are each independently a divalent metal ion selected from $Cu^{2+}$, $Ni^{2+}$, $Co^{2+}$, $Fe^{2+}$, $Mn^{2+}$, $Cr^{2+}$ $Pd^{2+}$, $Cd^{2+}$, $Ge^{2+}$, $Sn^{2+}$, $Bi^{2+}$, $Pb^{2+}$, and $Yb^{2+}$;
X1 to X5 are the same as or different from each other, and are each independently a halogen ion;
n is an integer from 1 to 9;
a is a real number of $0 < a < 1$;
b is a real number of $0 < b < 1$;
c is a real number of $0 < c < 1$;
d is a real number of $0 < d < 1$;
$b + c + d = 1$;
z is a real number of $0 < z < 3$; and
z' is a real number of $0 < z' < 3$.

Signed and Sealed this
Twelfth Day of April, 2022

Drew Hirshfeld
*Performing the Functions and Duties of the
Under Secretary of Commerce for Intellectual Property and
Director of the United States Patent and Trademark Office*